United States Patent [19]

Fujimoto

[11] Patent Number: 4,517,769

[45] Date of Patent: May 21, 1985

[54] METHOD AND APPARATUS FOR FORMING OBLIQUE GROOVE IN SEMICONDUCTOR DEVICE

[75] Inventor: Shigeru Fujimoto, Yokohama, Japan

[73] Assignee: Tokyo Shibaura Denki Kabushiki Kaisha, Kawasaki, Japan

[21] Appl. No.: 377,008

[22] Filed: May 11, 1982

[30] Foreign Application Priority Data

| May 20, 1981 | [JP] | Japan | 56-75893 |
| Jan. 20, 1982 | [JP] | Japan | 57-7138 |
| Jan. 25, 1982 | [JP] | Japan | 57-8882 |
| Jan. 25, 1982 | [JP] | Japan | 57-8883 |

[51] Int. Cl.³ .................. B24B 19/00; B24D 5/00
[52] U.S. Cl. .............. 51/105 R; 51/206 R; 51/283 R; 409/132; 409/166
[58] Field of Search ............. 51/103 C, 105 R, 106 R, 51/165.77, 165.8, 181, 206 R, 206.4, 206.5, 209 R, 131.1, 132, 281 SF, 283 R, 281 R; 409/132, 165, 166

[56] References Cited

U.S. PATENT DOCUMENTS

| 1,665,954 | 4/1928 | Fox | 51/106 R X |
| 2,197,309 | 4/1940 | Lackey | 51/209 R |
| 2,203,788 | 6/1940 | Jenks | 51/206 R X |
| 2,810,238 | 10/1957 | Yoho et al. | 51/106 R |
| 2,813,379 | 11/1957 | Trottier | 51/105 R |
| 3,137,976 | 6/1964 | Cooper | 51/106 R |
| 3,172,243 | 3/1965 | Laube | 51/105 R X |
| 3,691,707 | 9/1972 | Von Arx et al. | 51/206 R |
| 3,698,138 | 10/1972 | Wade et al. | 51/165.8 |
| 3,839,942 | 10/1974 | Ferchland | 409/132 |
| 4,029,531 | 6/1977 | Marinelli | 51/283 X |

FOREIGN PATENT DOCUMENTS

| 140471 | 5/1953 | Sweden | 51/206 R |
| 298992 | 8/1954 | Switzerland . | |
| 1237414 | 11/1968 | United Kingdom . | |
| 1491705 | 6/1974 | United Kingdom . | |

*Primary Examiner*—Robert P. Olszewski
*Attorney, Agent, or Firm*—Oblon, Fisher, Spivak, McClelland & Maier

[57] ABSTRACT

Method and apparatus for forming a ring-shaped oblique groove in a semiconductor device such as a semiconductor rectifier element for electric power. The method of the present invention is based on the idea of forming the ring-shaped oblique groove with a rotating grinding wheel. The semiconductor device is rotated, and the rotating grinding wheel is made to cut into the rotating semiconductor device to form the groove therein. The grinding wheel is sloped relative to the semiconductor device toward the center of the semiconductor device.

30 Claims, 20 Drawing Figures

METHOD AND APPARATUS FOR FORMING OBLIQUE GROOVE IN SEMICONDUCTOR DEVICE

BACKGROUND OF THE INVENTION

I. Field of the Invention

The present invention relates to a method and apparatus for forming an oblique groove in semiconductor devices and, more particularly, a method and apparatus for forming a ring-shaped oblique groove in semiconductor rectifier elements and the like for electric power so as to enhance their voltage durable characteristic.

II. Description of the Prior Art

The structure of conventional semiconductor rectifier element for electric power will be described referring to a longitudinally-sectioned view shown in FIG. 1. A semiconductor rectifier element 1 comprises a cathode layer (N+-type layer) 4 with which a cathode electrode 3 is resistance-contacted, a cathode neighboring layer (P-type layer) 5 adjacent to the cathode layer 4, a layer (N-type layer) 6 adjacent to the cathode neighboring layer 5 and having a high ratio of resistance, and an anode layer (P-type layer) 8 interposed between the high ratio resistance layer 6 and an anode electrode 7. Therefore, PN junctions J1, J2 and J3 are formed, respectively, at the borders among these four layers. In addition, an insulating groove 2 is formed in the circumference of rectifier element 1. The rectifier element 1 is of truncated conical shape. So, the area of circular cross-sectioned surface, perpendicular to the axis of the rectifier element, of P-type layer 8 is larger than that of N-type layer 6 at the PN junction J3. As is well known, the reason why the cross-sectioned area of P-type layer is made larger than that of N-type layer is to enhance the voltage durable characteristic of the rectifier element. When the cross-sectioned area of P-type layer 5 is similarly made larger than that of N-type layer 6 at the PN junction J2, the voltage durable characteristic of the rectifier element can be further enhanced. In order to achieve this, the ring-shaped insulating groove 2 is sloped with its bottom directed toward the center of the rectifier element 1, as shown in FIG. 1. Therefore, the portion of the element located inside the ring-shaped groove 2 becomes reverse conical, as shown in FIG. 1, and the cross-sectioned area of P-type layer 5 becomes larger than that of N-type layer 6, thus enhancing the voltage durable characteristic of the rectifier element. The cross-sectioned area of N-type layer 6 becomes larger than that of P-type layer 5 at the portion of rectifier element 1 located outside the ring-shaped groove 2. However, this causes no problem because the voltage durable characteristic of the rectifier element 1 is influenced only by that portion of rectifier element inside the ring-shaped groove 2 where the cathode electrode 3 and the cathode neighboring layer 4 are present.

The shape of ring-shaped oblique groove 2 influences the voltage durable characteristic of semiconductor rectifier element. Namely, the voltage durability becomes larger as the width W of the opening of oblique groove 2 becomes larger. Further, the voltage durability also becomes larger as the radius of curvature R of the bottom of groove 2 becomes smaller. Furthermore, the angle $\theta$ formed by the wall 2a of oblique groove 2 located on the center side of rectifier element 1 and the PN junction J2 also influences the voltage durable characteristic of the rectifier element.

The ring-shaped oblique groove 2 is conventionally formed as follows using the sand blast process. The rectifier element of truncated conical shape is held by a rotary device and rotated concentrically therewith. Particles of grinding sand are jetted onto the rotating rectifier element through a sand blast nozzle connected to a sand supply means. Jetted particles of sand grind and remove the semiconductor to form the ring-shaped groove 2.

This sand blast process has, however, the following drawbacks. Firstly, the radius R of curvature of groove bottom becomes large, as shown in FIG. 2, thus making the voltage durable characteristic worse. Secondly, processing accuracy is low, making uncertain the value of angle $\theta$ formed by the wall 2a located on the center side of the rectifier element and the PN junction J2. Therefore, the voltage durable characteristic is different for every rectifier element. Thirdly, processing efficiency is low. Fourthly, particles of sand are scattered during the process, thus making the working circumstance worse and providing a fear that the health of working persons can be injured.

SUMMARY OF THE INVENTION

A principal object of the present invention is therefore to provide a method of forming an oblique groove in semiconductor devices with high accuracy.

Another object of the present invention is to provide a method of forming in the power semiconductor rectifier element an insulating oblique groove the opening of which has a large width and a small radius of its bottom curvature so as to enhance the voltage durable characteristic.

A further object of the present invention is to provide a method of forming an oblique groove in semiconductor devices with high efficiency.

A still further object of the present invention is to provide an apparatus for carrying out the method of the present invention.

The method of the present invention is based on the idea of forming a ring-shaped oblique groove in semiconductor devices by a rotating grinding wheel. The method of the present invention comprises the steps of:

(a) rotating a semiconductor device around an axis passing through the center or the vicinity of the center of the surface of the semiconductor device and perpendicular to the surface in which a ring-shaped oblique groove is to be formed;

(b) rotating a grinding wheel, whose cross-sectioned surface is circular, around an axis passing through the center of this circle and perpendicular to the circle, the plane which includes the circular cross-sectioned surface of the grinding wheel being sloped toward the center of the surface of the semiconductor device; and (c) under these conditions, moving the rotating grinding wheel toward the semiconductor device to cut into the surface of the semiconductor device, whereby a ring-shaped oblique groove sloped toward the center of semiconductor device is formed in the surface of the semiconductor device.

The method of the present invention employs a grinding wheel to form the oblique groove. Therefore, the groove can be formed with higher accuracy and efficiency as compared with the conventional sand blast process. As will be described later, the width of groove opening can be made large while the radius of groove bottom curvature can be made small by selecting the shape of grinding wheel employed. When an insulating groove is formed in the semiconductor rectifier element according to the method of the present invention, therefore, the voltage durable characteristic of the rectifier element thus obtained can be made excellent.

DETAILED DESCRIPTION OF THE PREFERRED EMBODIMENTS

Figure 1:
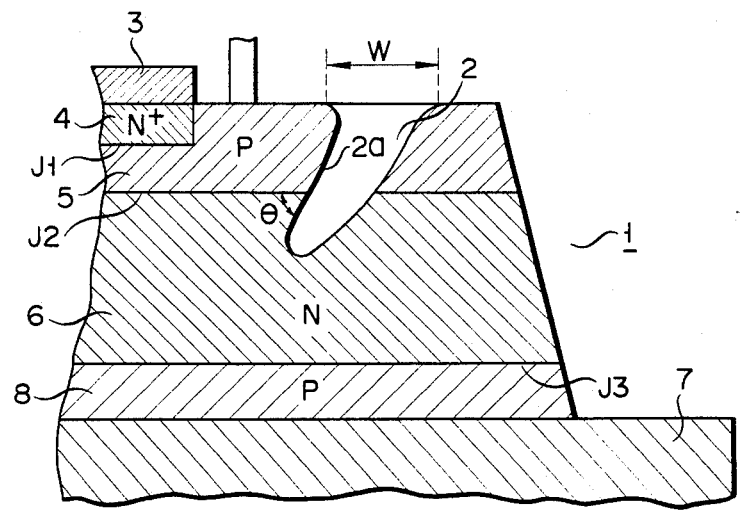
FIG. 1 is a sectional view showing the structure of a semiconductor rectifier element for electric power.
Figure 2:
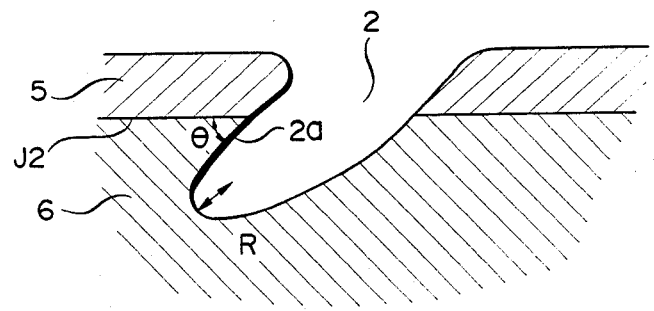
FIG. 2 is a sectional view showing the shape of a groove formed according to the conventional sand blast process.

Some preferred embodiments of the present invention will be described using the semiconductor rectifier element for electric power as an example.

As already described, the semiconductor rectifier element is provided with a ring-shaped oblique insulating groove whose bottom is sloped toward the center of the element. According to the present invention, this groove is formed as follows using an apparatus shown in FIG. 3.

The apparatus includes a means 12 for rotating a rectifier element 1 and a groove grinding section 13 provided with a grinding wheel 11. The rectifier element 1 is fixed to a holder 16 by vacuum suction. The holder 16 is connected to a motor 18 through a shaft 15 supported by a bearing 14, a pulley 17, a belt 21, a pulley 20 and a shaft 19. When the motor 18 rotates, therefore, the rectifier element 1 is rotated.

The grinding wheel 11 is sandwiched between a pair of flanges 31a and 31b and fixed to a shaft 30. The cross-sectioned surface of grinding wheel 11 is circular. The grinding wheel is a thin disk, for example. The shaft 30 is perpendicular to the grinding wheel 11, passing through the center thereof. The plane including the cross-sectioned circular surface of grinding wheel 11 is sloped toward the center side of rectifier element 1. Namely, an angle α exists between the plane including the cross-sectioned circular surface of grinding wheel 11 and a normal 32 extending from the rectifier element 1. The angle α is preferably about 30 degrees. The shaft 30 is supported by a bearing 29 and connected to a motor 28. When the motor 28 rotates, therefore, the grinding wheel 11 is rotated.

The motor 28 and the bearing 29 are fixed on a cutting feed table 27 which can go forward and backward by a motor 25 in a direction shown by an arrow 26. Cutting feed table 27 is also rotatable in a direction shown by an arrow 33 permitting the angle α to be adjusted.

The cutting feed table 27 is mounted on a transversely-feed table 24, which can be moved in a direction shown by an arrow 23 by turning a handle 22, thus enabling the diameter of a ring-shaped groove to be adjusted. The transversely-feed table 24 can also be moved in a direction vertical to the drawing sheet.

In operation, the transversely-feed table 24 is adjusted to an appropriate position by turning the handle 22. The position of cutting feed table 27 is adjusted to set the angle α to a predetermined value. Under these conditions, motors 18 and 28 are rotated to rotate the rectifier element 1 and the grinding wheel 11. The motor 25 is rotated to move the cutting feed table 27 toward the rectifier element 1. The grinding wheel 11 thus cuts into the rectifier element 1 to form the ring-shaped oblique groove 2 in the surface of rectifier element 1. Obviously, the ring-shaped groove 2 is sloped with its bottom directed toward the center side of the rectifier element.

The grinding wheel 11 may cut into the rectifier element 1 by moving the cutting feed table 27 at a constant speed. However, the ring-shaped oblique groove 2 can be more preferably formed by controlling the cutting feed speed as follows. The cutting feed speed is held slow until the grinding wheel 11 contacts the rectifier element 1 and for a while after the contact between the grinding wheel 11 and the rectifier element 1. The cutting feed speed is then made fast to grind the main portion of groove 2. Finally, the cutting feed speed is again made slow to grind the bottom of groove 2. In short, the groove 2 is ground by changing the cutting feed speed two times, from slow to fast and back to slow.

Figure 4:
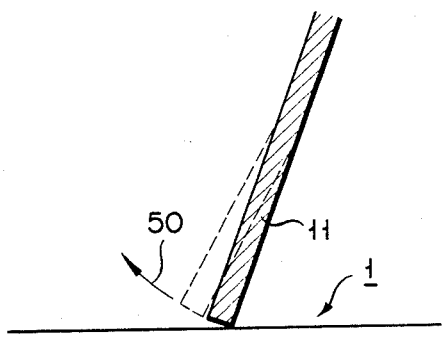
FIG. 4 shows the bending of the tip of the grinding wheel which may be caused when the grinding wheel contacts the surface of semiconductor device.

This will be described in more detail using a disk-shaped grinding wheel as an example. The feeding speed of cutting feed table 27 is made slow at a region, which will be hereinafter referred to as the "primary grinding region", just before the grinding wheel 11 contacts the rectifier element 1 and until both axial sides of grinding wheel 11 contact the rectifier element 1. Doing so, the grinding wheel 11 can be prevented from bending, which is caused by the existence of a transverse component force which overcomes the stiffness of the grinding wheel 11. Such a force component can be imposed on the grinding wheel 11 when the grinding wheel 11 contacts the surface of the rectifier element 1, in a direction shown by an arrow 50 of FIG. 4. Thus, the processing accuracy is enhanced and the lifetime of grinding wheel 11 is prolonged.

Figure 5:
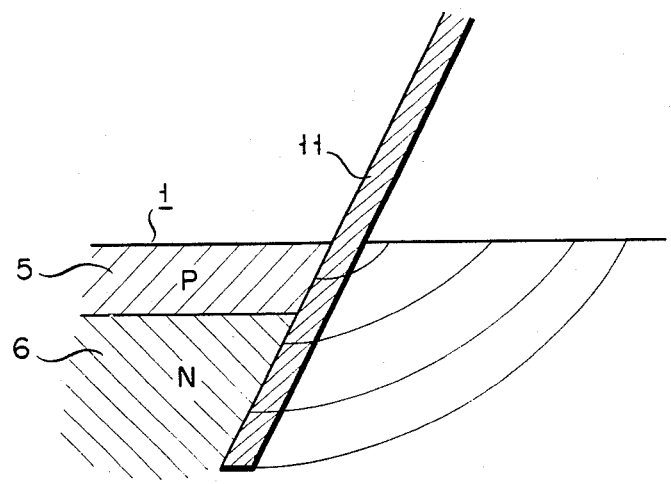
FIG. 5 is a view employed to explain the relation between the depth to which the grinding wheel cuts and the amount of semiconductor removed by the grinding wheel.

The cutting feed speed is then made fast to grind the main region of groove 2, which will be hereinafter referred to as the "main grinding region". The reason why the main grinding region is ground at fast cutting feed speed resides in the enhancement of processing efficiency. If the groove 2 is ground holding the cutting feed speed constant, the grinding resistance increases as the cutting depth becomes deeper. This is because the amount of rectifier element removed by the grinding wheel 11 per a unit time increases as the cutting becomes deeper, as shown in FIG. 5. If the main grinding region is ground at a constant speed, therefore, the apparatus still reserves power at the time of the grinding the initial portion of main grinding region. However, the apparatus must have power enough to grind the groove, overcoming the resistance at the time of the grinding the final portion of main grinding region where the grinding resistance becomes large. Therefore, when the cutting feed speed is continuously changed to make the resistance constant at the time of grinding the main grinding region, the apparatus can be used with maximum efficiency.

After the depth of groove 2 reaches its previously-set depth at several tens $\mu$m, the cutting feed speed is again made slow to finish the grinding of groove 2. The region of groove ground at this stage will be hereinafter referred to as the "finish grinding region". As described above, when the cutting feed speed is made constant, the grinding resistance increases as the cutting depth becomes deeper. When the groove 2 is ground, keeping the cutting feed speed constant, therefore, the largest grinding resistance is generated at the final stage of grind. Thus, defects such as fractured layers, chipping and cracks are caused in the surface of groove 2. Therefore, the generation of these defects are avoided when the finish grinding region is ground at slow cutting feed speed.

Figure 6:
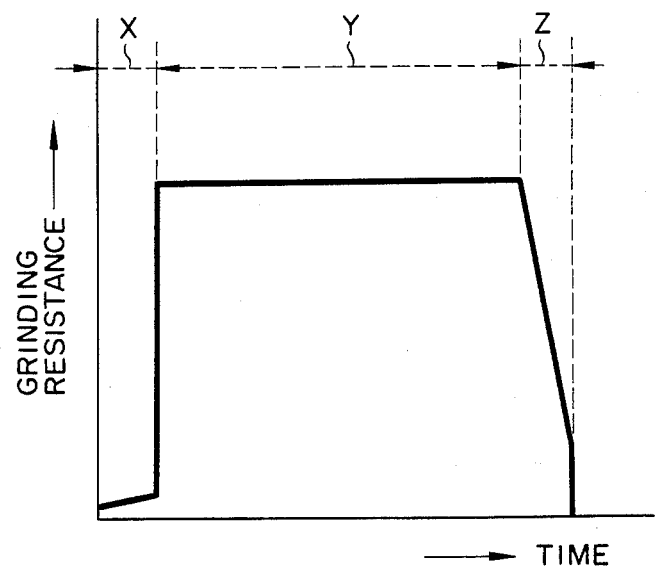
FIG. 6 is a view showing the change of cutting speed in a preferable mode of the present invention.
Figure 7:
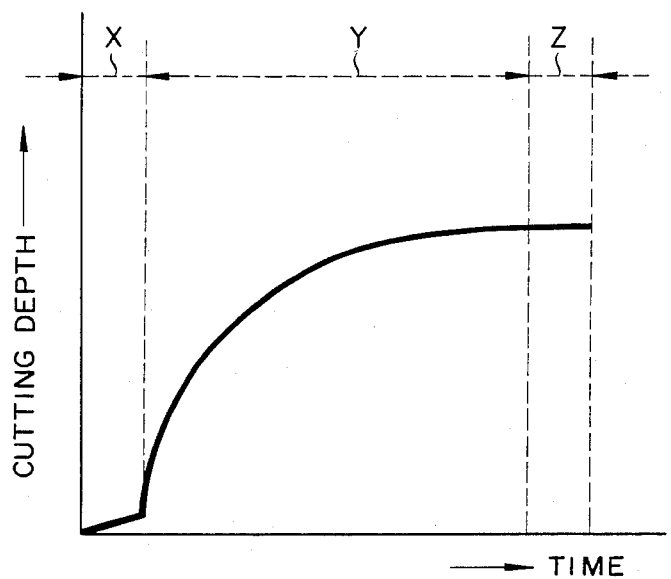
FIG. 7 is a view showing the relation between cutting time and depth in the same mode as in FIG. 6.

The control of this cutting feed speed as described above is briefed in FIGS. 6 and 7, in which X, Y and Z represent the primary, main and finish grinding regions, respectively.

Figure 8:
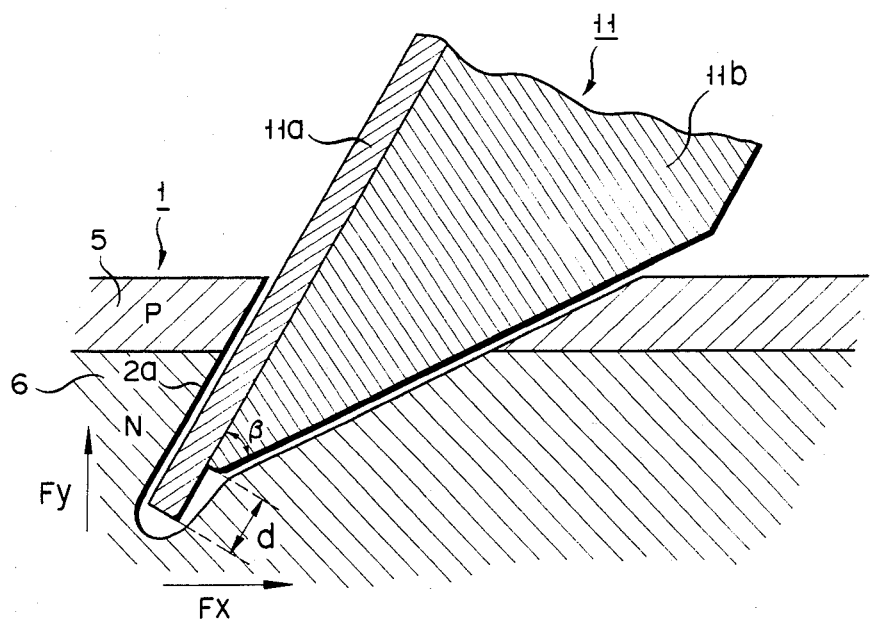
FIG. 8 shows a grinding wheel particularly suitable for use in the method of the present invention.
Figure 9:
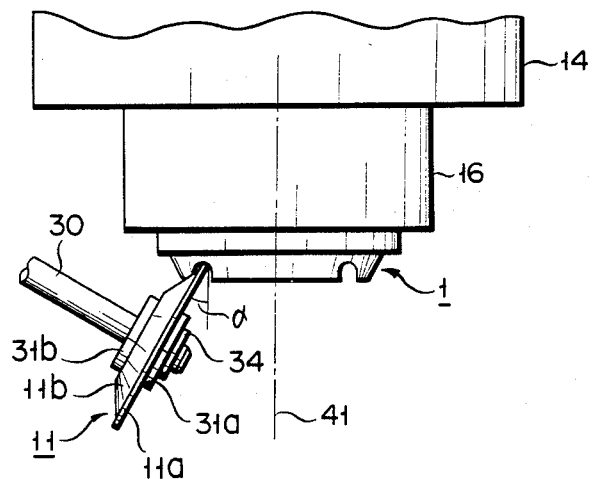
FIG. 9 is a view employed to explain the process of grinding a groove by means of the grinding wheel shown in FIG. 8.

As described above, a disk-shaped grinding wheel can be employed in the method of the present invention. When the insulating groove is formed in a semiconductor rectifier element for electric power according to the method of the present invention, however, it is particularly preferable to employ a grinding wheel such as is shown in FIG. 8. This grinding wheel comprises a truncated conical grinding wheel 11b and a disk-shaped flat grinding wheel 11a attached to the base of truncated conical grinding wheel 11b. The radius of the disk grindlng wheel 11a is made slightly larger than that of the truncated conical grinding wheel 11b. Therefore, the disk grinding wheel 11a projects by the distance (d) from the circumference of the truncated conical grinding wheel 11b, as shown in FIG. 8. The distance represented by (d) preferably ranges from 50 $\mu$m to 500 $\mu$m. The disk grinding wheel 11a is preferably 15–125 $\mu$m thick, while the truncated conical grinding wheel 11b is preferably 200 $\mu$m–1 mm thick. It is particularly preferable when the disk grinding wheel 11a is about 50 $\mu$m thick while the truncated conical grinding wheel 11b is about 450 $\mu$m thick. It is preferable that an angle $\beta$ formed by the generatrix and the base of the truncated conical grinding wheel 11b is smaller than 60°, most preferably about 35°. The disk grinding wheel 11a may be attached to the truncated conical grinding wheel 11b by means of an adhesive. However, the grinding wheels 11a and 11b may be attached to each other by being sandwiched between a pair of flanges 31a and 31b and fastened by a nut 34 as shown in FIG. 9. If so, only the disk grinding wheel 11a may be exchanged with a new one when it is worn.

Figure 3:
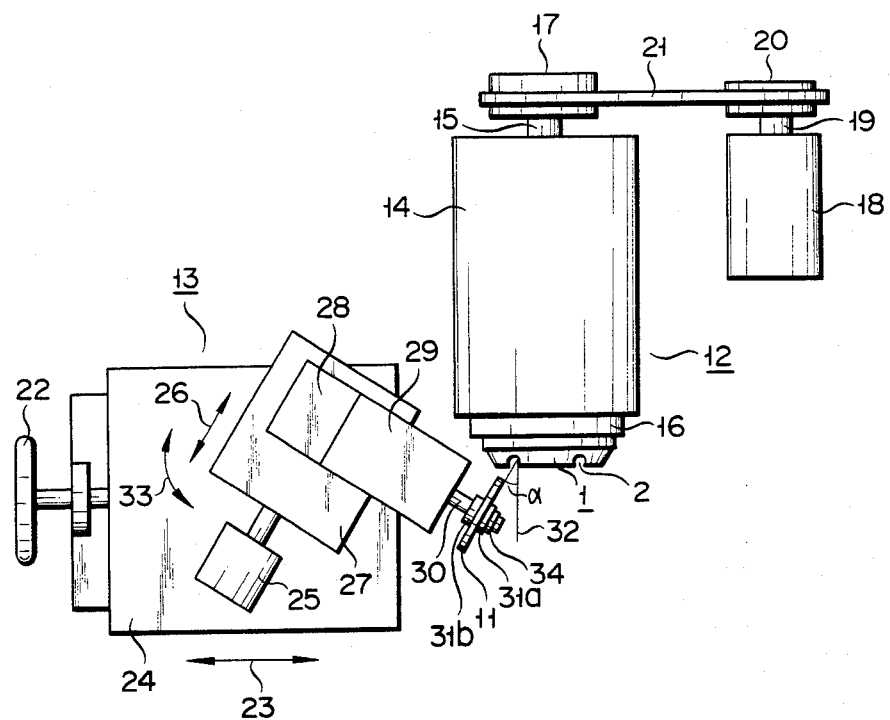
FIG. 3 is a schematic view showing an apparatus of the present invention.

Even when this binary grinding wheel is employed, the ring-shaped oblique groove can be formed according to the same operation as described referring to FIG. 3. In this case, however, the grinding wheel is used in a manner such that its truncated conical piece 11b faces a normal 41 extending through the center of the rectifier element 1, as shown in FIG. 9. Even when this binary grinding wheel is employed, it is preferable to control the cutting feed speed as described above.

As already described referring to FIG. 1, the voltage durability of the semiconductor rectifier element becomes larger as the width W of the groove opening is made larger and the radius R of the groove bottom curvature is made smaller. As is apparent from FIG. 8, the width of the groove opening is made large when a binary grinding wheel is used, because the truncated conical piece 11b grinds to form a wider opening. Since the bottom of the groove is ground by the thin disk piece 11a, the radius of its curvature can be made smaller. In addition, the disk piece 11a projects by (d) from the circumference of the truncated conical piece 11b, so that the radius of the groove bottom curvature can be held smaller even when the disk piece 11a is worn. Therefore, when the insulating groove is ground in the semiconductor rectifier element using this binary grinding wheel, the voltage durability can be made larger.

When this binary grindstone is employed to grind the groove, component forces Fx and Fy act on the disk piece 11a, as shown in FIG. 8. The component force Fx greatly influences the life of the grinding wheel, but since the disk piece 11a is supported by the truncated conical piece 11b in the case of a binary grinding wheel, the disk piece 11a is not broken even when it is subjected to a relatively large level of the component force Fx. As described above, the radius of the groove bottom curvature is not made large even when the disk piece 11a is worn. Therefore, the life of the grinding wheel may be extended.

Since the width of the groove opening can also be made large by using the truncated conical grinding wheel alone, the voltage durability of the rectifier element is enhanced higher than in the case of using the disk grinding wheel alone. When the truncated conical grinding wheel alone is employed, however, the radius of groove bottom curvature is also made large. In addition, the radius of the groove bottom curvature becomes larger and larger rapidly as the grinding wheel is worn. The life of the grinding wheel is decreased accordingly.

Figure 10:
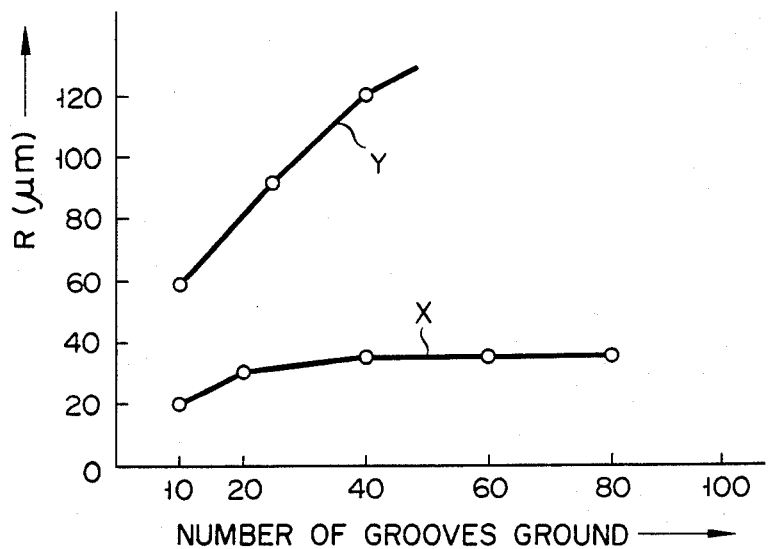
FIG. 10 is a view showing how the radius of groove bottom curvature varies when grooves are ground in plural semiconductor devices using the grinding wheel shown in FIG. 8 and another one.

Symbol X in FIG. 10 represents changes in the radius R of groove bottom curvature when grooves are formed in plural semiconductor rectifier elements using the binary grinding wheel. Symbol Y in FIG. 10 represents results obtained when grooves are formed using the truncated conical grinding wheel alone. As apparent from FIG. 10, the radius R of curvature is held small when the binary grinding wheel is used, and it is not made large even when the binary grinding wheel is continuously used to grind plural grooves.

Figure 11:
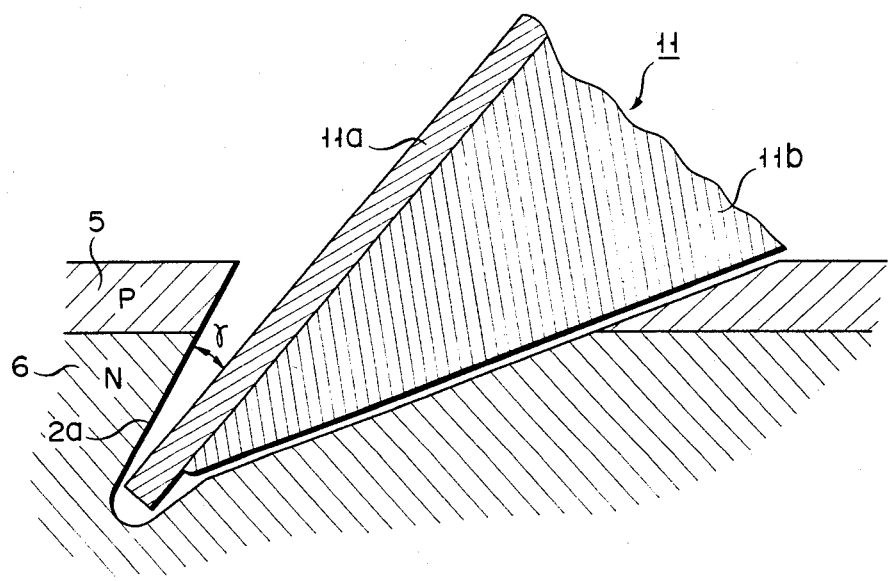
FIG. 11 is a view employed to explain another preferable mode according to the present invention.
Figure 12:
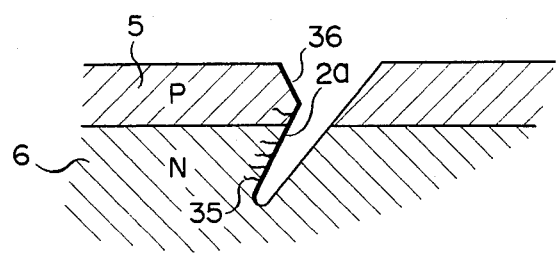
FIG. 12 is a view showing chipping and fractured layer which may be caused when the groove is ground.

When the binary grinding wheel is used to grind the groove, the grinding can be carried out usually holding the disk piece 11a contacted with the inner groove wall 2a located on the center side of the rectifier element, as shown in FIG. 8 (a space exists between the disk piece 11a and the groove wall 2a in FIG. 8, but the space is intended to clarify the illustration and in practice the disk piece 11a and the groove wall 29 are in contact with each other). However, it is more preferable that the grinding is carried out providing a relief angle $\gamma$ between the disk piece 11a and the inner groove circumference 2a, as shown in FIG. II. The relief angle $\gamma$ ranges from several seconds to several degrees. When the grinding is carried out like this, friction between the planar surface of the disk piece 11a and the inner groove circumference 2a may be avoided. Therefore, the occurrence of fractured layers 35, micro-cracks and chipping 36 (see FIG. 12) which may be caused by this friction in the inner groove circumference 2a may be substantially avoided. As a result, the voltage durability may be enhanced. In addition, the life of disc piece 11a can be made longer. When the grinding is carried out providing the relief angle $\gamma$ between the disk piece 11a and the inner groove circumference 2a, friction between the truncated conical piece 11b and the outer groove circumference becomes a little larger, as is apparent from FIG. 11. However, it is only the state of the inner groove circumference 2a that gives influence to the characteristic of rectifier element. Therefore, the characteristic of the rectifier element does not depend upon fractured layers and micro-cracks which are caused by the friction in the outer groove circumference.

Figure 13:
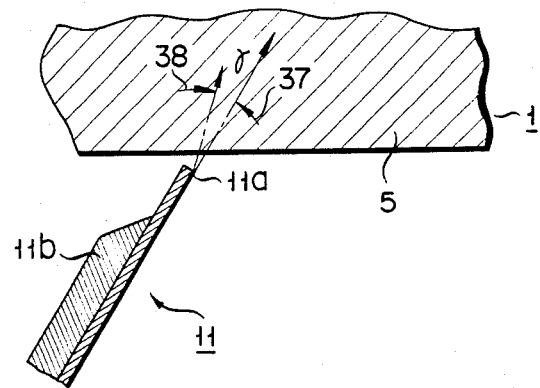
FIGS. 13 and 14 are views employed to explain in more detail the mode shown in FIG. 11.
Figure 14:
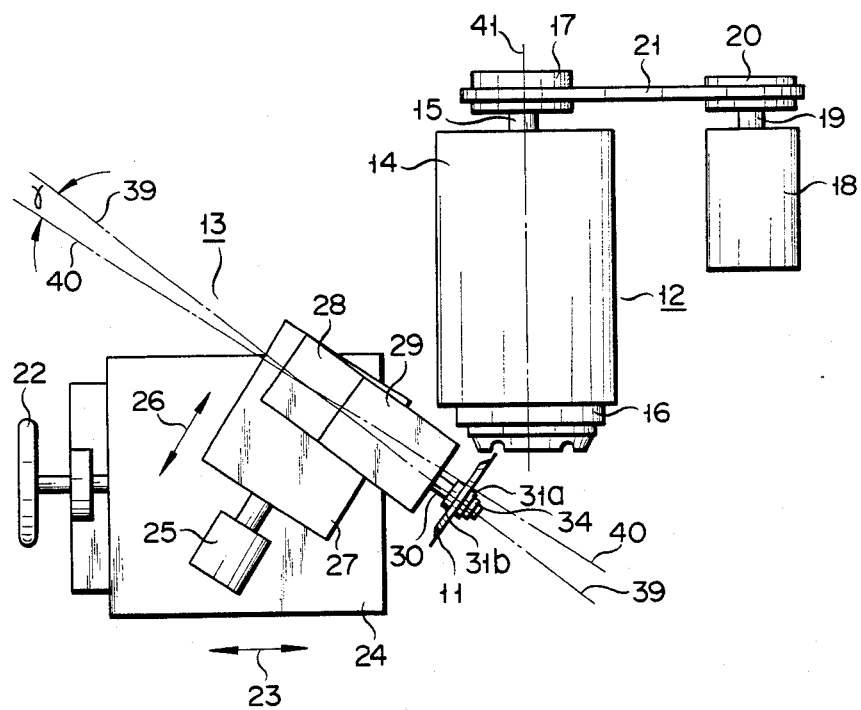

When it is expressed in other words that the grinding is carried out providing the relief angle $\gamma$ between the disk piece 11a and the inner groove circumference 2a, the cutting direction of the grinding wheel is shifted by the angle $\gamma$ from a plane 37, which includes the circular cross-sectioned surface of the grinding wheel 11, to the outside of the rectifier element. That is, the grinding is carried out moving the grinding wheel 11 in a direction 38, as shown in FIG. 13. This may be achieved using the apparatus which has been described referring to FIG. 3. Namely, the grinding wheel 11 may be advanced in such a way that the shaft 30 of the grinding wheel 11 overlaps on a direction 39 which is shifted by the angle $\gamma$ from a direction 40 perpendicular to the cutting feed direction 26, as shown in FIG. 14.

Figure 15:
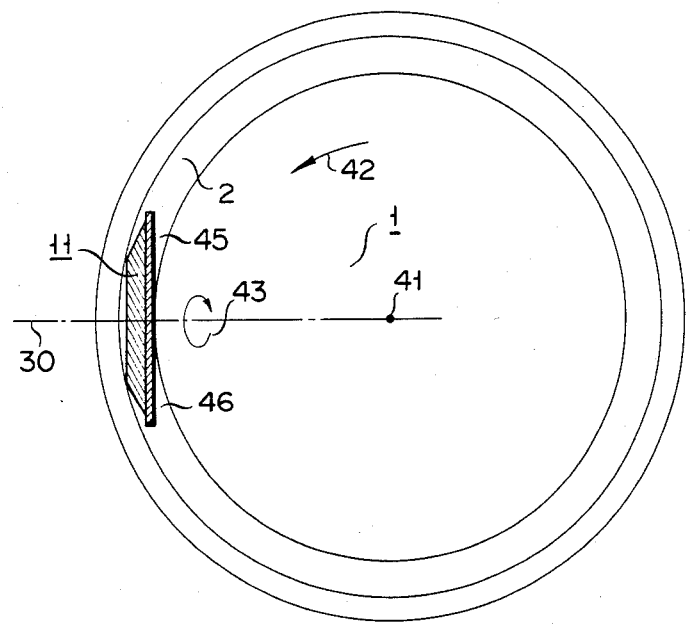
FIG. 15 is a view showing the positional relation between the rotating axis of the grinding wheel and the semiconductor device when cutting is carried out along the surface of the semiconductor device in a preferred embodiment of the invention.
Figure 16:
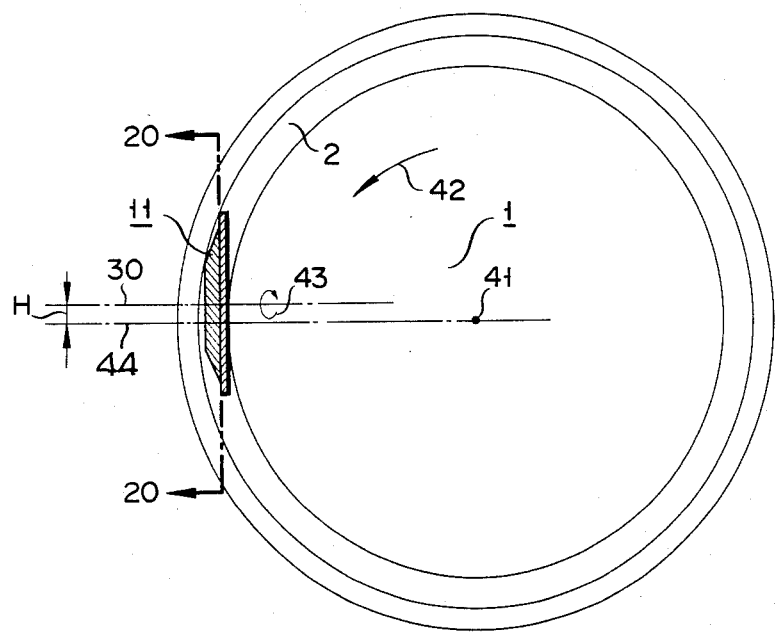
FIG. 16 is a sectional view taken along the surface of the semiconductor device to show the positional relation between the rotating axis of the grinding wheel and the semiconductor device in another preferable mode according to the present invention.
Figure 17:
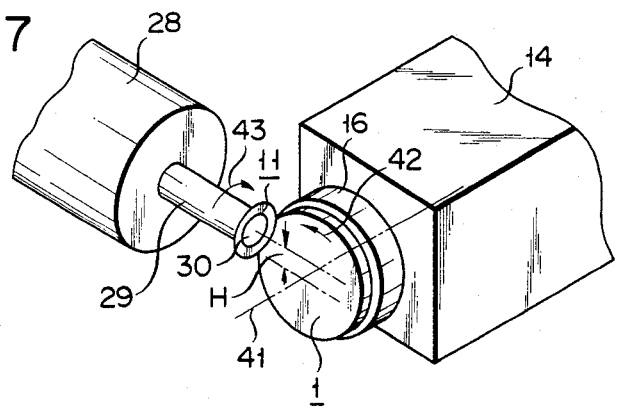
FIGS. 17 and 20 are perspective views employed to explain the mode shown in FIG. 16.

The rectifier element 1 can be ground while rotating shaft 30 of grinding wheel 11 and rotating shaft 41 of rectifier element 1 on a same plane, as shown in FIG. 15, the rotating shaft 41 of rectifier element 1 being vertical relative to the drawing sheet. In a particularly preferable mode of the present invention, however, the grinding is carried out with the rotating shaft 30 of grinding wheel 11 shifted by H from a plane (whose end face is shown by a dot-and-dash line 44) parallel to the rotating shaft 30 and including the rotating shaft 41 of rectifier element 1, as shown in FIG. 16. H ranges from several micrometers to several millimeters. The rectifier element 1 is rotated in a direction shown by an arrow 42 while the grinding wheel 11 is preferably rotated in a direction shown by an arrow 43 in this case. Namely, the rotating shaft 30 of the grinding wheel 11 is shifted by a distance H from the plane which is parallel to the rotating shaft 30 and which includes the rotating shaft 41 of the rectifier element 1, in a direction opposite to the direction in which the rectifier element 1 is rotated at its contact portion with the grinding wheel 11. It is preferable in this case that the grinding wheel 11 is rotated in such a way that its contact portion with the rectifier element 1 is moved in same direction as the rotating direction of the rectifier element 1 at the contact portion. This can be seen in the perspective view shown in FIG. 17.

Figure 18:
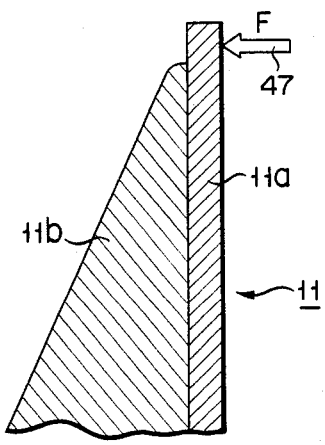
FIGS. 18 and 19 are views showing forces acting on the grinding wheel when the groove is ground.
Figure 19:
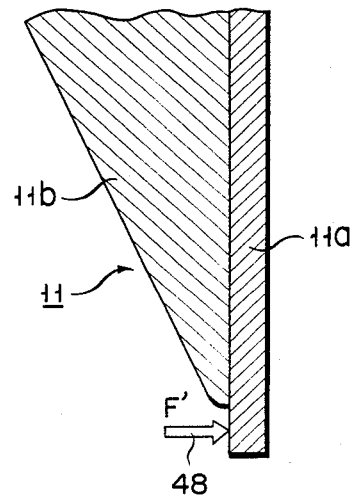

When the grinding is carried out like this, the processing accuracy may be enhanced and the life of grinding wheel may last longer. The reason is as follows. When the rectifier element 1 is ground keeping rotating shaft 30 of the grinding wheel 11 and rotating shaft 41 of the rectifier element 1 on same plane, as shown in FIG. 15, component force F shown by an arrow 47 in FIG. 18 is exerted on the end of the disk piece 11a on the cutting side of the grinding wheel 11 (or side 45 in FIG. 15). This is because the rectifier element 1 is rotating in the direction of the arrow 42. However, since the disk piece 11a is rigidly supported by the truncated conical piece 11b to thereby have a high stiffness, there is substantially no fear that the disk grinding wheel 11a will be broken. On the other hand, component force F' acts on the end of disk grinding wheel 11a in a direction shown by an arrow 48 in FIG. 19 on the cut-chips discharging side (or side 46 in FIG. 15) where the grinding wheel comes out of rectifier element 1. The acting direction of component force F' corresponds in this case to the direction in which the disk piece 11a is peeled from the truncated conical piece 11b. Therefore, the strength of the grinding wheel is weak in rigidity and liable to break, thus causing the life of the grinding wheel to be decreased.

Figure 20:
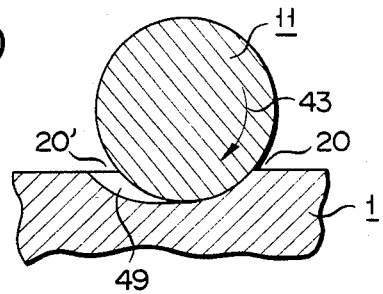

In contrast, in the case of the embodiment described referring to FIG. 16, the rotating shaft of the grinding wheel 11 is shifted on a side reverse to the rotating direction of rectifier element 1 at its contact point with the grinding wheel 11. Therefore, the grinding wheel 11 does not contact the rectifier element 1 on the cut-chips discharging side, and the oblique groove 2 is processed only on the cutting side as can be seen in FIG. 20, which is a sectional view taken along a line 20—20' in FIG. 16. As is apparent from FIG. 20, a clearance 49 exists between the grinding wheel 11 and the rectifier element 1 on the cut-chips discharging side. Therefore, substantially no component force such as is shown by the arrow 48 in FIG. 19 acts on the disk piece 11a in the direction in which the disk piece 11a is peeled from the truncated conical piece 11b, thus ensuring that the grinding wheel 11 not will not break easily and that its life will be kept long. Since the clearance 49 is formed on the cut-chips discharging side, cut-chips can be easily discharged, and grinding resistance and process heat are reduced. This also contributes toward prolonging the lifetime of grinding wheel 11.

When the grinding wheel 11 is rotated in such a way that its contact portion with the rectifier element 1 moves in the same direction as the rotating direction of the rectifier element 1 at the contact portion, the grinding is carried out at the time when particles of the grinding wheel move in the direction tending to compress the rectifier element 1, thus suppressing the occurrence of chipping of the edge portion of the groove and fractured layers in the inner groove circumference. Therefore, the voltage durable characteristic of rectifier element 1 can be enhanced.

Although some preferred embodiments of the present invention have been described in detail, it should be understood that various modifications, changes and omissions can be made within the scope of the present invention. The semiconductor rectifier element for electric power has been employed as an example of semiconductor device in the above-described embodiments, but the method of the present invention can be applied to other semiconductor devices such as giant transistors.

What is claimed as new and desired to be secured by Letters Patent of the United States is:

1. A method of forming a circular oblique groove in a semiconductor device, said method comprising the steps of:
   (a) rotating a semiconductor device having an at least approximately planar surface about a first axis passing through said at least approximately planar surface, said first axis being perpendicular to said at least approximately planar surface of said semiconductor device;
   (b) rotating a grinding wheel
      (i) having a planar forward surface disposed in a plane, said planar forward surface being circular in shape,
      (ii) which comprises a first component of truncated cone shape having a first base, a second base which is larger in diameter than the first base, and a conical grinding surface which joins the first and second bases and a second component of disk shape coaxially attached to the second base of said first component without an appreciable gap therebetween, said second component being larger in diameter than the second base of said first component, said planar forward surface of said grinding wheel being the surface of said second component which is remote from said first component,
      (iii) about a second axis passing through the center of said planar forward surface of said grinding wheel, said second axis being perpendicular to said planar forward surface of said grinding wheel and the plane including said planar forward surface of said grinding wheel intersecting said first axis at a first angle $\alpha$ which is an acute angle; and
   (c) under these conditions, moving said grinding wheel into said semiconductor device so as to cut a circular oblique groove into said at least approximately planar surface of said semiconductor device while said planar forward surface faces said first axis extending from the center of said at least approximately planar surface of said semiconductor device,
   whereby a circular oblique groove which is sloped toward the center of said semiconductor device is ground in said at least approximately planar surface of said semiconductor device.

2. The method according to claim 1 wherein the attachment of said first component to said second component is achieved in such a way that they are sandwiched and fastened between a pair of flanges on a single rotating shaft.

3. The method according to claim 1 wherein the thickness of said first component is between 200 μm and 1 mm.

4. The method according to claim 1 wherein the thickness of said second component is between 15 μm and 125 μm.

5. The method according to claim 1 wherein the conical surface of said first component is angled away from said planar forward surface of said second component by a second angle $\beta$ which is smaller than 60°.

6. The method according to claim 5 wherein said second angle $\beta$ if about 35°.

7. The method according to claim 1 wherein the radius of said second component is between 50 μm and 500 μm larger than the radius of the second base of said first component, so that the outer circumference of said second component projects between 50 μm and 500 μm from the outer circumference of said first component.

8. The method according to claim 1 wherein step (c) comprises moving said grinding wheel toward said semiconductor device in the plane including said planar forward surface of said grinding wheel.

9. The method according to claim 1 wherein said second axis and said first axis are in the same plane.

10. The method according to claim 1 wherein the angle between said first axis and said second axis is about 30°.

11. The method according to claim 1 wherein said second axis is perpendicular to but does not intersect said first axis, said second axis being parallel to a line which is perpendicular to said first axis, intersects said first axis, and is located in the plane of said surface of said semiconductor device, said second axis being spaced from said line in the direction opposite to the direction of rotation of said semiconductor device.

12. The method according to claim 11 wherein the spacing between said line and said second axis is between several micrometers and several millimeters.

13. The method according to claim 11 wherein said grinding wheel is rotated in a manner such that the point of contact between said grinding wheel and said semiconductor device moves in the same direction as the direction of rotation of said semiconductor device at the point of contact.

14. A method of forming a circular oblique groove in a semiconductor device, said method comprising the steps of:
   (a) rotating a semiconductor device having an at least approximately planar surface about a first axis passing through said at least approximately planar surface, said first axis being perpendicular to said at least approximately planar surface of said semiconductor device;
   (b) rotating a grinding wheel
      (i) having a planar forward surface disposed in a plane, said planar forward surface being circular in shape,
      (ii) which comprises a first component of truncated cone shape having a first base, a second base which is larger in diameter than the first base, and a conical grinding surface which joins the first and second bases and a second component of disk shape coaxially attached to the second base of said first component without an appreciable gap therebetween, said second component being larger in diameter than the second base of said first component, said planar forward surface of said grinding wheel being the surface of said second component which is remote from said first component, (iii) about a second axis passing through the center of said planar forward surface of said grinding wheel, said second axis being perpendicular to said planar forward surface of said grinding wheel and the plane including said planar forward surface of said grinding wheel intersecting said first surface at a first angle $\alpha$ which is an acute angle; and (c) under these conditions, moving said grinding wheel into said semiconductor device so as:

(i) to cut a circular oblique groove into said at least approximately planar surface of said semiconductor device while said planar forward surface faces said first axis extending from the center of said at least approximately planar surface of said semiconductor device and (ii) to provide a relief angle $\gamma$ between said planar forward surface of said second component and the radially inner surface of said circular oblique groove.

15. The method according to claim 14 wherein the operation of making said grinding wheel cut into said at least appoximately planar surface of said semiconductor device is achieved in such a way that said grinding wheel is moved in a direction which is shifted by said relief angle $\gamma$ from the plane including said planar forward surface of said grinding wheel.

16. The method according to claim 15 wherein the operation of making said grinding wheel cut into said at least approximately planar surface of said semiconductor device is achieved in such a way that said second axis is shifted by said relief angle $\gamma$ from a direction perpendicular to said direction in which said grinding wheel is moved as it cuts into said at least approximately planar surface of said semiconductor device.

17. The method according to claim 16 wherein said second axis is perpendicular to but does not intersect said first axis, said second axis being parallel to a line which is perpendicular to said first axis, intersects said first axis, and is located in the plane of said surface of said semiconductor device, said second axis being spaced from said line in the direction opposite to the direction of rotation of said semiconductor device.

18. The method according to claim 17 wherein the spacing between said line and said second axis is between several micrometers and several millimeters.

19. The method according to claim 15 Wherein said second axis is perpendicular to but does not intersect said first axis, said second axis being parallel to a line which is perpendicular to said first axis, intersects said first axis, and is located in the plane of said surface of said semiconductor device, said second axis being spaced from said line in the direction opposite to the direction of rotation of said semiconductor device.

20. The method according to claim 19 wherein the spacing between said line and said second axis is between several micrometers and several millimeters.

21. The method according to claim 14 wherein said relief angle $\gamma$ ranges from several seconds to several degrees.

22. The method according to claim 14 wherein said second axis is perpendicular to but does not intersect said first axis, said second axis being parallel to a line Which is perpendicular to said first axis, intersects said first axis, and is located in the plane of said surface of said semiconductor device, said second axis being spaced from said line in the direction opposite to the direction of rotation of said semiconductor device.

23. The method according to claim 22 wherein the spacing between said line and said second axis is between several micrometers and several millimeters.

24. An apparatus for forming a circular oblique groove in a semiconductor device, said apparatus comprising:

(a) first means for holding a semiconductor device having an at least approximately planar surface for rotating it about a first axis passing through said at least approximately planar surface, said first axis being perpendicular to said at least approximately planar surface of said semiconductor device;

(b) a grinding wheel;

(i) having a planar forward surface disposed in a plane, said planar forward surface being circular in shape, (ii) which comprises a first component of truncated cone shape having a first base, a second base which is larger in diameter than the first base, and a conical grinding surface which joins the first and second bases and a second component of disk shape coaxially attached to the second base of said first component without an appreciable gap therebetween, said second component being larger in diameter than the second base of said first component, said planar forward surface of said grinding wheel being the surface of said second component which is remote from said first component;

(c) second means for rotating said grinding wheel about a second axis passing through the center of said planar forward surface of said grinding wheel, said second axis being perpendicular to said planar forward surface of said grinding wheel and the plane including said planar forward surface of said grinding wheel intersecting said first axis at a first angle $\alpha$ which is an acute angle; and (d) third means for translating said grinding wheel toward said semiconductor device, thereby cutting a circular oblique groove into said at least approximately planar surface of said semiconductor device, said circular oblique groove being sloped toward said first axis.

25. The apparatus according to claim 24 wherein said first component is 200 $\mu$m to 1 mm thick.

26. The apparatus according to claim 24 wherein said second component is 15 $\mu$m to 125 $\mu$m thick.

27. The apparatus according to claim 24 wherein the conical surface of said first component is angled away from said planar forward surface on said second component by a second angle $\beta$ which is smaller than 60°.

28. The apparatus according to claim 27 wherein said second angle $\beta$ is about 35°.

29. The apparatus according to claim 24 wherein the radius of said second component is 50 $\mu$m to 500 $\mu$m larger than that of the second base of said first component, so that the outer circumference of said second component projects 50 $\mu$m to 500 $\mu$m from the outer circumference of said first component.

30. The apparatus according to any one of claims 24–29 wherein the angle between said first axis and said second axis is about 30°.

* * * * *